US011335748B2

(12) United States Patent
Zhang et al.

(10) Patent No.: US 11,335,748 B2
(45) Date of Patent: May 17, 2022

(54) TRANSPARENT OLED SUBSTRATE, DISPLAY PANEL AND OLED SUBSTRATE

(71) Applicant: KunShan Go-Visionox Opto-Electronics Co., Ltd., Kunshan (CN)

(72) Inventors: Lu Zhang, Kunshan (CN); Xiaoyang Tong, Kunshan (CN); Zhiwei Zhou, Kunshan (CN); Junhui Lou, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 93 days.

(21) Appl. No.: 17/010,115

(22) Filed: Sep. 2, 2020

(65) Prior Publication Data

US 2020/0403048 A1    Dec. 24, 2020

Related U.S. Application Data

(63) Continuation of application No. PCT/CN2019/093321, filed on Jun. 27, 2019.

(30) Foreign Application Priority Data

Dec. 28, 2018  (CN) .......................... 201811630104.5

(51) Int. Cl.
*H01L 27/32* (2006.01)
*H01L 51/50* (2006.01)
*H01L 51/52* (2006.01)

(52) U.S. Cl.
CPC ...... *H01L 27/3246* (2013.01); *H01L 51/5056* (2013.01); *H01L 51/5072* (2013.01);
(Continued)

(58) Field of Classification Search
CPC ............. H01L 27/3246; H01L 51/5209; H01L 51/5234; H01L 27/3211
See application file for complete search history.

(56) References Cited

U.S. PATENT DOCUMENTS

2005/0101044 A1    5/2005  Cho et al.
2009/0195144 A1    8/2009  Kitabayashi
(Continued)

FOREIGN PATENT DOCUMENTS

CN    103311269 A    9/2013
CN    104319283 A    1/2015
(Continued)

OTHER PUBLICATIONS

International Search Report dated Oct. 8, 2019 in corresponding International application No. PCT/CN2019/093321; 4 pages.
(Continued)

*Primary Examiner* — Anthony Ho
(74) *Attorney, Agent, or Firm* — Maier & Maier, PLLC

(57) ABSTRACT

The present disclosure provides a transparent OLED substrate, a display panel, and an OLED substrate. The transparent OLED substrate includes: a base substrate; a first electrode layer formed over the base substrate; a pixel defining layer formed over the first electrode layer, the pixel defining layer including a plurality of pixel defining holes penetrating the pixel defining layer to the first electrode layer, and an exposed area of the first electrode layer is equal to an area of the pixel defining hole; a light emitting layer formed over the pixel defining layer and including organic light emitting blocks; a second electrode layer formed over the light emitting layer; wherein each of the pixel defining holes corresponds to a plurality of the organic light emitting blocks.

20 Claims, 17 Drawing Sheets

(52) U.S. Cl.
CPC ...... *H01L 51/5092* (2013.01); *H01L 51/5209* (2013.01); *H01L 51/5234* (2013.01); *H01L 51/5237* (2013.01); *H01L 2251/308* (2013.01)

(56) References Cited

U.S. PATENT DOCUMENTS

| | | |
|---|---|---|
| 2012/0098737 A1 | 4/2012 | Kim et al. |
| 2017/0062535 A1 | 3/2017 | Kim et al. |

FOREIGN PATENT DOCUMENTS

| | | |
|---|---|---|
| CN | 204315576 U | 5/2015 |
| CN | 105206643 A | 12/2015 |
| CN | 106328077 A | 1/2017 |
| CN | 106936958 A | 7/2017 |
| CN | 107750354 A | 3/2018 |
| CN | 108305891 A | 7/2018 |
| CN | 108336117 A | 7/2018 |
| CN | 108511492 A | 9/2018 |
| CN | 108648675 A | 10/2018 |
| JP | 2009111047 A | 5/2009 |
| TW | 201714490 A | 4/2017 |

OTHER PUBLICATIONS

Written Opinion of the International Searching Authority dated Oct. 8, 2019 in corresponding International application No. PCT/CN2019/093321; 6 pages.

First Chinese Office Action and Search Report dated May 11, 2020 in corresponding Chinese application No. 201811630104.5; 15 pages.

Second Chinese Office Action dated Jul. 20, 2020 in corresponding Chinese application No. 201811630104.5; 13 pages.

Taiwanese Office Action dated Apr. 6, 2020 in corresponding Taiwanese application No. 108123667; 11 pages.

though the distances between the adjacent first electrodes are unchanged. Therefore, according to

TRANSPARENT OLED SUBSTRATE, DISPLAY PANEL AND OLED SUBSTRATE

CROSS-REFERENCE TO RELATED APPLICATION

This application is a continuation application of International Application No. PCT/CN2019/093321 filed on Jun. 27, 2019, which claims priority to Chinese patent application No. 201811630104.5 filed on Dec. 28, 2018. Both applications are incorporated herein by reference in their entireties.

TECHNICAL FIELD

The present disclosure relates to the field of display technologies.

BACKGROUND

In the display field, in order to control the display state of each sub-pixel, generally, a corresponding control circuit is configured for the sub-pixel. In addition, in the art, a black matrix masking control circuit can also be provided to avoid an abnormal display effect of a screen.

A ratio of an overall area of a black matrix to an overall area of the sub-pixel in each sub-pixel is referred to as an aperture ratio, which determines an efficiency of light passing through each sub-pixel and has a certain correlation with brightness of the screen.

SUMMARY

In order to improve the aperture ratio of the organic light emitting block, the present disclosure provides a transparent OLED substrate, a display panel, an OLED substrate, a display screen, and a display device.

According to a first aspect of the embodiments of the present disclosure, a transparent OLED substrate is provided, including:

a base substrate;

a first electrode layer formed over the base substrate;

a pixel defining layer formed over the first electrode layer and including a plurality of pixel defining holes penetrating the pixel defining layer to the first electrode layer, and an exposed area of the first electrode layer being equal to an area of the pixel defining holes;

a light emitting layer formed in the pixel defining layer and including organic light emitting blocks; and a second electrode layer formed over the light emitting layer, where each of the pixel defining holes corresponds to a plurality of the organic light emitting blocks.

Optionally, the first electrode layer includes a plurality of rows of first electrodes arranged along a first direction, and a longitudinal direction of the first electrodes extend along the first direction or a second direction, the first direction is perpendicular to the second direction, and the second electrode layer is a planar electrode. The first electrodes on the first electrode layer are arranged regularly, which can effectively reduce the processing difficulty, and the second electrode layer uses a planar electrode structure, which can further simplify the process steps and reduce production costs.

Optionally, the first electrode includes at least one block electrode, and the block electrode corresponds to the organic light emitting block in one-to-one correspondence, where each of the pixel defining holes corresponds to at least one of the block electrodes. Each block electrode corresponds to one organic light-emitting block, so that the organic light emitting block can be vapor deposited on the corresponding block electrode, which can effectively reduce the risk of color mixing.

Optionally, the first electrode includes at least one stripe electrode, and each of the stripe electrodes corresponds to a plurality of the organic light emitting blocks, where each of the pixel defining holes corresponds to at least one of the stripe electrodes. The use of a stripe electrode can effectively reduce the difficulty of processing the first electrode layer, and since each strip electrode corresponds to a plurality of the organic light emitting blocks, when the organic light emitting blocks remains the same, the number of the strip electrodes can be reduced, and the probability of light diffraction can be reduced.

Optionally, the organic light emitting blocks corresponding to a same row of the first electrodes have a same color. It can effectively avoid color mixing.

Optionally, the organic light emitting blocks corresponding to two adjacent rows of the first electrodes have a same color or different colors. Through the cooperation between the organic light emitting blocks on the adjacent two rows of first electrodes, the display state of the corresponding display area of the OLED substrate can be enriched and the display effect can be improved.

Optionally, a length direction of the pixel defining hole is perpendicular or parallel to the first direction.

Optionally, in a width direction of the pixel defining hole, a size of the organic light emitting block is not smaller than a size of the corresponding pixel defining hole. In the width direction of the pixel defining hole, the organic light emitting block covers the width exposed by the pixel defining hole to increase the effective display area as much as possible.

Optionally, each of the first electrodes corresponds to a plurality of rows of the organic light emitting blocks arranged along the first direction, and two adjacent organic light emitting blocks over the same first electrode in the first direction are arranged in a staggered pattern. Since the two adjacent organic light emitting blocks in the first direction are arranged in a staggered pattern, the organic light emitting blocks can be arranged at each position along the length in the second direction to improve the display effect.

Optionally, a distance between central axes of two adjacent organic light emitting blocks over the first electrode in the first direction is 0.5-2 times a size of the organic light emitting block in the first direction.

Optionally, each of the first electrodes includes:

a plurality of first sub-electrodes arranged in a staggered pattern, and each of the first sub-electrodes includes a plurality of block electrodes; and a connecting portion respectively and electrically connected with two adjacent block electrodes of the adjacent block electrodes, to obtain the wave-shaped first electrodes extending in the second direction.

Optionally, the first electrode includes a block electrode and/or a stripe electrode, in the second direction, each of the block electrodes or each of the stripe electrodes has two wave shaped edges, and peaks of the two edges are arranged opposite to each other, and troughs of the two edges are arranged opposite to each other. Therefore, between different positions along the width of the first electrode and where the adjacent first electrodes have different distances, the positions of the generated diffraction fringes are different, and the diffraction effects at different positions can cancel each other, which can effectively reduce the diffraction effect.

Optionally, a width between opposite peaks of two edges is in a range of 30 um to (A−X) um;

a width between opposite troughs of two edges is larger than X and smaller than the width between opposite peaks; where A is a size of the organic light emitting block, X is a width value at a part of the electrode having the smallest size, and the A is larger than or equal to (30+X) um.

Optionally, the first electrode includes a block electrode and/or a stripe electrode, each of the block electrodes or each of the stripe electrodes has a projection on the base substrate of a shape including at least one first graphic unit, and the first graphic unit is circular, elliptical, dumbbell-shaped, "8"-shaped, or rectangular;

the light emitting structure block has a projection on the base substrate of a shape including at least one second graphic unit;

the second graphic unit includes a circular shape, an elliptical shape, a dumbbell shape, an "8" shape, or a rectangle shape.

Optionally, the first electrode layer and/or the second electrode layer are made of a transparent material.

Optionally, the light transmittance of the transparent material is larger than or equal to 90%.

Optionally, the transparent material includes one or more of indium tin oxide, indium zinc oxide, silver doped indium tin oxide, and silver doped indium zinc oxide Optionally, the light emitting layer includes an organic light emitting material layer and a common layer;

the common layer includes a hole injection layer, a hole transport layer, an electron transport layer, and an electron injection layer, and at least one layer of the common layer covers a gap between the first electrode layer and an adjacent first electrode. In this way, on the one hand, the processing difficulty of the layer structure covering the first electrode layer and the gap between the adjacent first electrodes on the common layer can be effectively reduced, and on the other hand, the first electrode layer and the second electrode layer can be isolated by the layer structure to avoid a short circuit.

Optionally, the transparent OLED substrate further includes:

a transparent support layer, wherein the transparent support layer is formed over the first electrode layer between two adjacent organic light emitting blocks; or, the transparent support layer is formed over the pixel defining layer. A mask is made by the transparent support layer to provide support for processing, and the support layer is a transparent structure, which can effectively reduce the blocking of light and improve the overall transmittance of the transparent OLED substrate.

Optionally, the second electrode layer includes a second electrode;

the second electrode is a single layer structure or a structure of laminated layers, when the second electrode is a single layer structure, the second electrode is a single metal layer, a single metal mixture layer, or a single transparent metal oxide layer; when the second electrode is a structure of laminated layers, the second electrode is a laminated-layers structure of a transparent metal oxide layer and a metal layer, or a laminated-layers structure of a transparent metal oxide layer and a metal mixture layer; or when a material of the second electrode is doped with metal, a thickness of the second electrode is larger than or equal to 100 angstroms and smaller than or equal to 500 angstroms, the thickness of the second electrode is continuous as a whole, and a transparency of the second electrode is larger than 40%; or when the material of the second electrode is doped with metal, the thickness of the second electrode is larger than or equal to 100 angstroms and smaller than or equal to 200 angstroms, the thickness of the second electrode is continuous as a whole, and a transparency of the second electrode is larger than 40%; or when the material of the second electrode is doped with metal, the thickness of the second electrode is larger than or equal to 50 angstroms and smaller than or equal to 200 angstroms, the thickness of the second electrode is continuous as a whole, and a transparency of the second electrode is larger than 50%; or when the material of the second electrode is doped with metal, the thickness of the second electrode is larger than or equal to 50 angstroms and smaller than or equal to 200 angstroms, the thickness of the second electrode is continuous as a whole, and a transparency of the second electrode is larger than 60%; or when the second electrode is a single layer structure, a material of the single layer metal layer is Al or Ag, a material of the single layer metal mixture layer is MgAg or Al doped metal mixed material, and the transparent metal oxide is ITO or IZO.

According to the second aspect of the embodiments of the present disclosure, a display panel is provided, including:

the transparent OLED substrate according to any one embodiment of the above; and an encapsulation layer, encapsulating on a side of the transparent OLED substrate away from the base substrate.

According to the third aspect of the embodiments of the present disclosure, an OLED substrate is provided, including:

a first OLED substrate, the first OLED substrate being the transparent OLED substrate according to any one embodiment of the above; and a second OLED substrate, the second OLED substrate being a non-transparent OLED substrate, the second OLED substrate including a base substrate, a third electrode layer formed over the base substrate, a light emitting layer formed over the third electrode layer, and a fourth electrode layer formed over the light emitting layer;

where the first OLED substrate and the second OLED substrate share the same base substrate, the light emitting layer of the first OLED substrate and the light emitting layer of the second OLED substrate are formed in the same process.

The second OLED substrate shares the base substrate with the first OLED substrate and forms the light emitting layers thereof in the same process, which can effectively reduce the process requirements. Moreover, since the OLED substrate is the transparent OLED substrate described in the above embodiments, the area corresponding to the transparent OLED substrate can be used for display while allowing light to pass through, so that the photosensitive device included in the electronic device equipped with the OLED substrate can be disposed below the transparent OLED substrate to ensure that the photosensitive device can work normally and does not occupy the display area, thus effectively increasing the screen ratio.

It can be known from the above embodiments that in the length direction of the pixel defining hole in the present disclosure, the length of the effective light emitting area of each organic light emitting block is equal to the actual processing length of the organic light emitting material in this direction, so that the size of the effective light emitting area can be relatively large, and therefore the aperture ratio can be effectively improved when the black matrix, pixel area, and the like remain the same.

BRIEF DESCRIPTION OF THE DRAWINGS

The accompanying drawings, which are incorporated in and constitute a part of this specification, illustrate examples consistent with the present disclosure and, together with the description, serve to explain the principles of the disclosure.

DETAILED DESCRIPTION OF THE EMBODIMENTS

Figure 1:
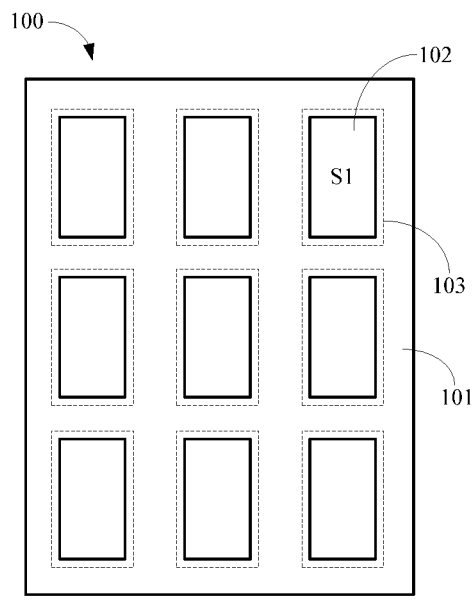
FIG. 1 is a schematic structural diagram of a substrate.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular examples only, and are not intended to limit the present disclosure. Terms determined by "a", "the" and "said" in their singular forms in the present disclosure and the appended claims are also intended to include plurality, unless clearly indicated otherwise in the context. It should also be understood that the term "and/or" as used herein is and includes any and all possible combinations of one or more of the associated listed items.

FIG. 1 is a schematic structural diagram of an array substrate 100. As shown in FIG. 1, the array substrate 100 may include a pixel defining layer 101 and a plurality of pixel defining holes 102 formed in the pixel defining layer 101, through which electrodes formed below the pixel defining layer 101 can be exposed. Therefore, when an organic light emitting material is formed in the pixel defining holes 102, the organic light emitting material can be brought into contact with the electrodes below the pixel defining layer 101.

Each pixel defining hole 102 corresponds to one organic light emitting block of the organic light emitting material. In a process, a coverage area 103 of the organic light emitting material (as shown by a dotted line in FIG. 1) should be larger than an area of the pixel defining hole 102, so as to ensure that the organic light emitting material is formed in each area of the electrode layer exposed by the pixel defining holes 102. A part of the organic light emitting material outside of the pixel defining hole 102 cannot emit light because the part of the organic light emitting material is located on the pixel defining layer 101. In other words, a boundary of an effective light emitting area S1 corresponding to each organic light emitting material is determined by a boundary of the pixel defining hole 102.

Figure 2:
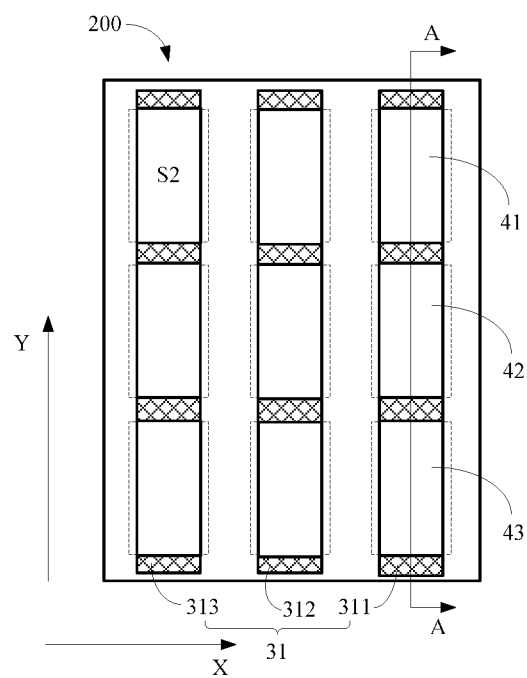
FIG. 2 is a first schematic structural diagram of a transparent OLED substrate according to an example of the present disclosure.
Figure 3:
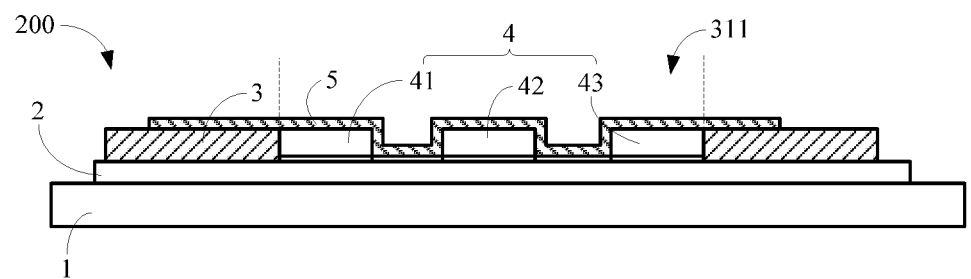
FIG. 3 is a cross sectional view of a transparent OLED substrate according to an example of the present disclosure.

FIG. 2 is a schematic structural diagram of a transparent OLED substrate according to an example of the present disclosure, and FIG. 3 is a cross sectional view of the transparent OLED substrate according to an example of the present disclosure. As shown in FIGS. 2 and 3, a transparent OLED substrate 200 is provided in the present disclosure. The transparent OLED substrate 200 may include a base substrate 1, a first electrode layer 2, a pixel defining layer 3, a light emitting layer 4, and a second electrode layer 5. The base substrate 1 may include a laminated structure having a substrate, an inorganic layer, an organic layer, and the like. The substrate may include a flexible substrate or a rigid substrate. Here, the flexible substrate may be made of a flexible material, and the flexible material may be polyimide (PI), polycarbonate (PC), polyethylene terephthalate (PET), or the like. The rigid substrate may be made of organic glass. The first electrode layer 2 is formed over the base substrate 1, the pixel defining layer 3 is formed over the first electrode layer 2, the light emitting layer 4 is formed in the pixel defining layer 3, and the second electrode layer 5 is formed over the light emitting layer 4. The light emitting layer 4 may include a plurality of organic light emitting blocks 41, 42 and 43; and the pixel defining layer 3 may include a plurality of pixel defining holes 31 penetrating the pixel defining layer 3 to the first electrode layer 2. The pixel defining holes 31 can expose a part of the electrode layer 2, an exposed area of the first electrode layer 2 is equal to an area of the pixel defining holes 31, and each pixel defining hole 31 may correspond to a plurality of organic light emitting blocks 41, 42 and 43.

As shown in FIG. 2, the pixel defining holes 31 may include a first pixel defining hole 311, a second pixel defining hole 312, and a third pixel defining hole 313. The organic light emitting blocks 41, 42 and 43 are formed in the first pixel defining hole 311. A boundary of an effective light emitting area S2 of the organic light emitting blocks 41, 42 and 43 in the direction X is determined by a boundary of the pixel defining hole 31, and a boundary of the effective light emitting area S2 in the direction Y is determined by an evaporation boundary of the organic light emitting blocks 41, 42 and 43. Then, a length of the effective light emitting area S2 of the organic light emitting blocks 41, 42 and 43 in the direction Y shown in FIG. 2 is equal to an actual length of the organic light emitting material in the direction Y. In other words, in a case of the same black matrix and the same pixel areas, the actual length of the organic light emitting blocks 41, 42 and 43 in the direction Y can be increased, so that the effective light emitting area of the transparent OLED substrate 200 can be increased and the aperture ratio can be improved.

Figure 4:
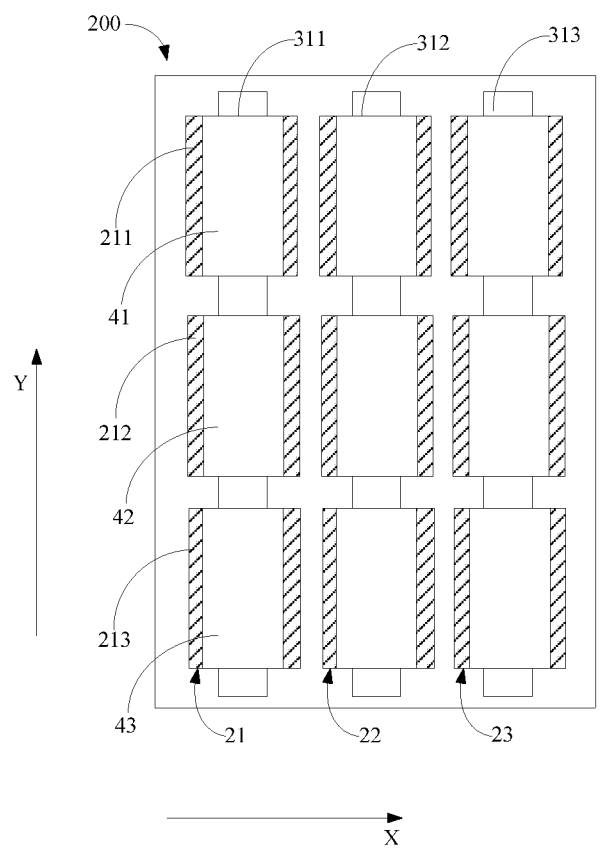
FIG. 4 is a schematic structural diagram of a transparent OLED substrate according to an example of the present disclosure.

FIGS. 4-12 are schematic structural diagrams of a transparent OLED substrate according to an example of the present disclosure. As shown in FIG. 4, the first electrode layer 2 may be regularly arranged over the base substrate 1 to reduce the process difficulty. For example, as shown in FIG. 4, the first electrode layer 2 may include a plurality of rows of first electrodes arranged in a first direction, and a longitudinal direction of the first electrode extends in a second direction. The first direction is perpendicular to the second direction. In an example of FIG. 4, the first direction is the direction X and the second direction is the direction Y. As shown in FIG. 4, the first electrode layer 2 may include a first electrode 21, a first electrode 22, and a first electrode 23, and the first electrodes 21, 22, and 23 are arranged side by side along the direction X. The longitudinal extension directions of the first electrodes 21, 22, and 23 are all the direction Y.

In some examples, the first electrodes 21, 22, and 23 may be arranged side by side along the direction Y in FIG. 4, and the longitudinal extension direction of the first electrodes 21, 22, and 23 are all the direction X, which is not limited in the present disclosure. In some examples, the second electrode layer 5 may be a planar electrode, and the second electrode layer 5 can cover each of the organic light emitting blocks 41, 42, and 43. The first electrode layer 2 may be an anode layer, and the second electrode layer 5 may be a cathode layer, so that a pressure difference between the anode and the cathode can make the organic light emitting blocks 41, 42 and 43 to emit lights spontaneously.

In an example, the second electrode layer 5 may include a second electrode, and the second electrode may be a single layer structure or a structure of laminated layers. When the second electrode is a single layer structure, the second electrode may be a single metal layer, a single metal mixture layer, or a single transparent metal oxide layer; when the second electrode is a structure of laminated layers, the second electrode may be a laminated-layers structure of a transparent metal oxide layer and a metal layer, or laminated-layers structure of a transparent metal oxide layer and a metal mixture layer.

In an example, when the material of the second electrode is doped with metal, the thickness of the second electrode is larger than or equal to 100 angstroms and smaller than or equal to 500 angstroms. Further, when the thickness of the second electrode is larger than or equal to 100 angstroms and smaller than or equal to 200 angstroms, the thickness of the second electrode is continuous as a whole, and the transparency of the second electrode is larger than 40%.

In an example, when the material of the second electrode is doped with metal, the thickness of the second electrode is larger than or equal to 50 angstroms and smaller than or equal to 200 angstroms. The thickness of the second electrode is continuous as a whole, and the transparency of the second electrode is larger than 50%. Further, the transparency of the second electrode is larger than 60%.

In an example, the second electrode may be a single layer structure, and a material of the single layer metal layer may be Al or Ag. A material of the single layer metal mixture layer may be MgAg or Al doped metal mixed material. The transparent metal oxide may be ITO or IZO.

In an example, the first electrode may include a plurality of block electrodes, each of the pixel defining holes may correspond to a plurality of block electrodes, the plurality of block electrodes correspond to a plurality of organic light emitting blocks one by one, and each of the pixel defining holes can correspond to a plurality of block electrodes. In an example, as shown in FIG. 4, the first electrode layer 2 may include first electrodes 21, 22 and 23 which are sequentially arranged along the direction X and extend longitudinally along the direction Y. Taking the first electrode 21 as an example, the first electrode 21 may include block electrodes 211, 212, and 213. In other examples, the first electrode 21 may include two, four, or more than four blocks. The numbers of block electrodes included in the first electrodes 21, 22, and 23 may be the same or different, which is not limited in the present disclosure.

In an example, the light emitting layer 4 may include organic light emitting blocks 41, 42 and 43, and the pixel defining hole 31 may include a first pixel defining hole 311, a second pixel defining hole 312 and a third pixel defining hole 313 arranged in the direction X. That is, the direction X is the width direction of the first pixel defining hole 311, the second pixel defining hole 312, and the third pixel defining hole 313, and the direction Y is the length direction of the first pixel defining hole 311, the second pixel defining hole 312 and the third pixel defines hole 313. As shown in FIG. 4, the organic light emitting block 41 is in contact with the block electrode 211, the organic light emitting block 42 is in contact with the block electrode 212, and the organic light emitting block 43 is in contact with the block electrode 213; and the block electrodes 211, 212, and 213 can be exposed through the same pixel defining hole (i.e., the first pixel defining hole 311 shown in FIG. 4). In the direction Y, each of the block electrodes 211, 212 and 213 exposed by the first pixel defining hole 311 has a length equal to an actual length of the block electrode 211, 212 and 213 in the direction Y, respectively, so that the actual exposed length of the block electrode can be increased, thereby increasing the effective light emitting area of each of the organic light emitting blocks.

Figure 5:
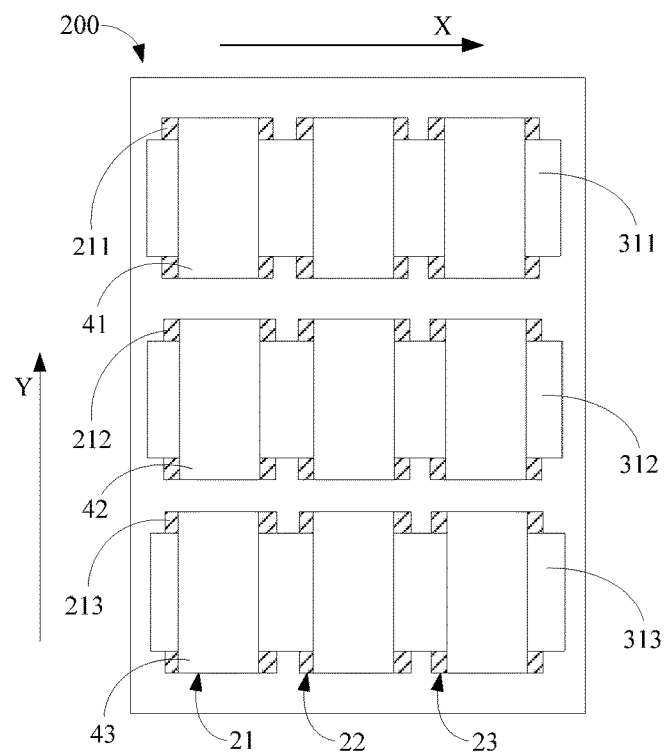
FIG. 5 is a schematic structural diagram of a transparent OLED substrate according to an example of the present disclosure.

In addition to the case where the length direction of the first pixel defining hole 311, the second pixel defining hole 312, and the third pixel defining hole 313 is parallel to the longitudinal extension directions of the first electrodes 21, 22, and 23 shown in FIG. 4, the present disclosure may also provide another implementation. As shown in FIG. 5, the length direction of the first pixel defining hole 311, the second pixel defining hole 312, and the third pixel defining hole 313 is perpendicular to the longitudinal extension direction of the first electrodes 21, 22, and 23. That is, the first pixel defining hole 311, the second pixel defining hole 312, and the third pixel defining hole 313 are arranged along the direction Y, and the direction X is the length direction of the first pixel defining hole 311, the second pixel defining hole 312, and the third pixel defining hole 313.

Figure 6:
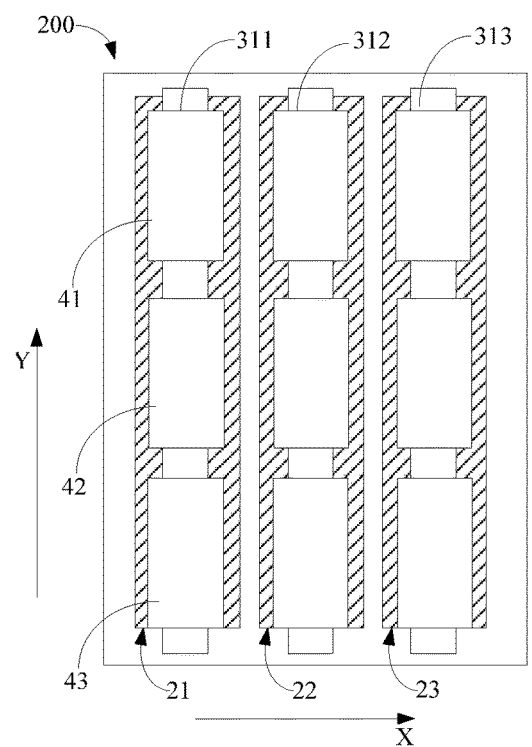
FIG. 6 is a schematic structural diagram of a transparent OLED substrate according to an example of the present disclosure.

In another example, the first electrode may include a stripe electrode, each stripe electrode may correspond to a plurality of organic light emitting blocks, and each pixel defining hole may correspond to at least one stripe electrode. The first electrodes 21, 22, and 23 included in the first electrode layer 2 are stripe electrodes that extend longitudinally in the same direction. As shown in FIG. 6, the first electrodes 21, 22, and 23 are arranged along the direction X and extends longitudinally along the direction Y. The light emitting layer 4 may include organic light emitting blocks 41, 42 and 43, and the organic light emitting blocks 41, 42 and 43 are provided corresponding to the stripe electrode 21.

In an example, the pixel defining hole 31 may include a first pixel defining hole 311, a second pixel defining hole 312, and a third pixel defining hole 313 arranged in the direction X, that is, the direction X is the width direction of the first pixel defining hole 311, the second pixel defining hole 312 and the third pixel defining hole 313, and the direction Y is the length direction of the first pixel defining hole 311, the second pixel defining hole 312 and the third pixel defining hole 313. As shown in FIG. 6, the first pixel defining hole 311 corresponds to the first electrode 21, the second pixel defining hole 312 corresponds to the first electrode 22, and the third pixel defining hole 313 corresponds to the first electrode 23. Based on this, the lengths of the first electrodes 21, 22, and 23 in the direction Y can be completely exposed, so as to achieve the objective of increasing the effective light emitting area. Moreover, since the structure of the stripe electrode is adopted, the processing difficulty of the first electrode layer 2 can be effectively reduced.

Figure 7:
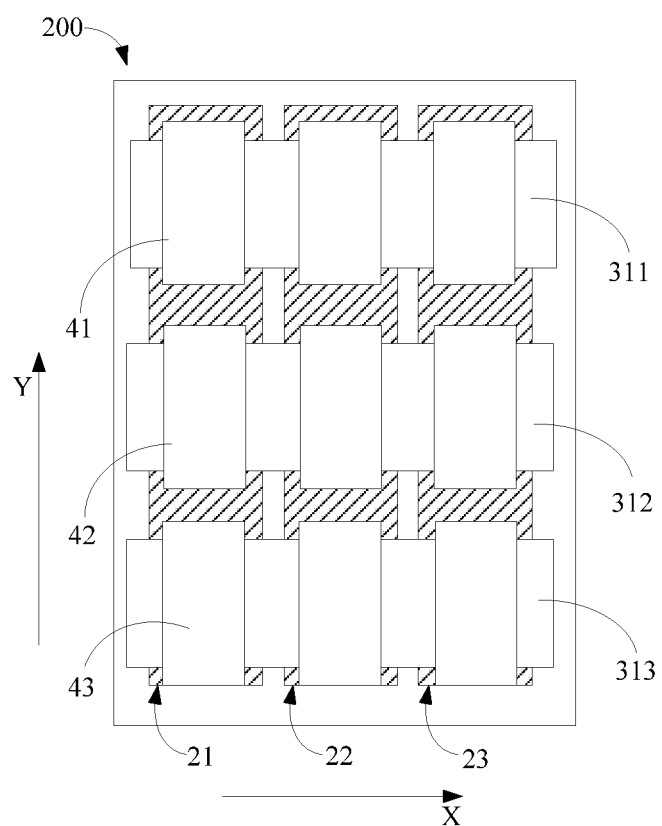
FIG. 7 is a schematic structural diagram of a transparent OLED substrate according to an example of the present disclosure.

In addition to the case where the length direction of the first pixel defining hole 311, the second pixel defining hole 312, and the third pixel defining hole 313 is parallel to the longitudinal extension directions of the first electrodes 21, 22, and 23 as shown in FIG. 6, the present disclosure may also provide another implementation. As shown in FIG. 7, the length direction of the first pixel defining hole 311, the second pixel defining hole 312, and the third pixel defining hole 313 is perpendicular to the longitudinal extension direction of the first electrodes 21, 22, and 23. That is, the first pixel defining hole 311, the second pixel defining hole 312, and the third pixel defining hole 313 are arranged along the direction Y, and the direction X is the length direction of the first pixel defining hole 311, the second pixel defining hole 312, and the third pixel defining hole 313.

Figure 8:
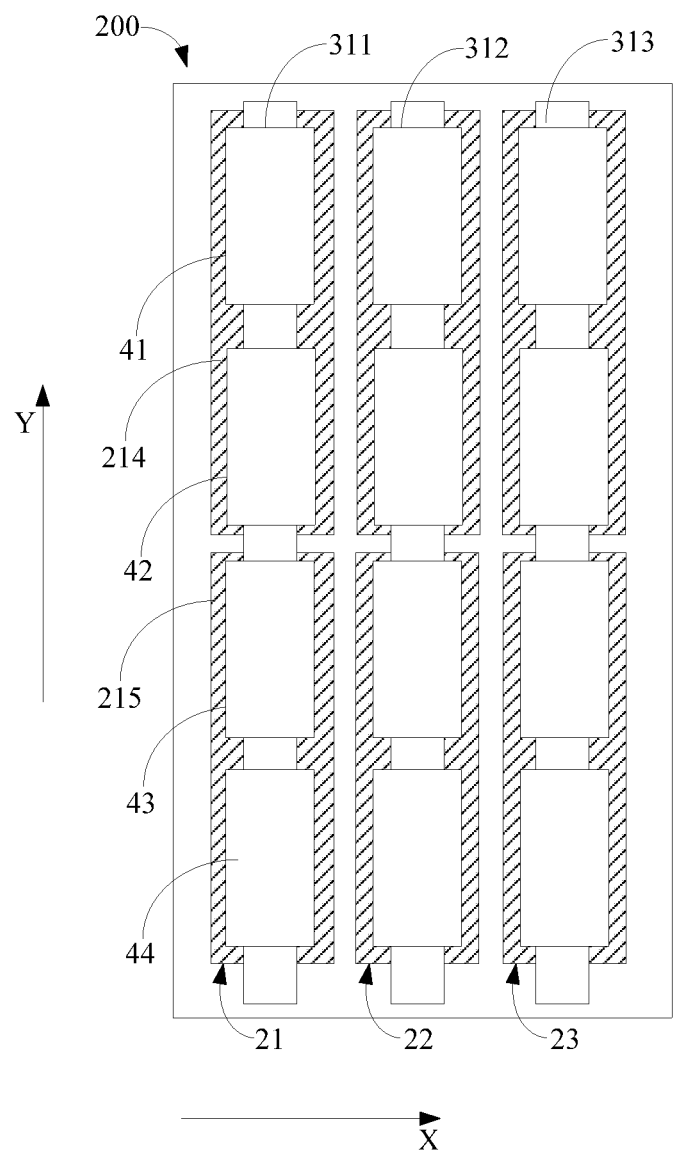
FIG. 8 is a schematic structural diagram of a transparent OLED substrate according to an example of the present disclosure.

In an example, the first electrode may include a plurality of stripe electrodes, each stripe electrode may correspond to a plurality of organic light emitting blocks, and each pixel defining hole may correspond to at least one stripe electrode. As shown in FIG. 8, the first electrode layer 2 may include the first electrodes 21, 22, and 23, the first electrodes 21, 22, and 23 are arranged along the direction X, and the longitudinal extension direction of the first electrodes 21, 22, and 23 is the direction Y. In addition, the first electrodes 21, 22, and 23 may each include a plurality of stripe electrodes. Taking the first electrode 21 as an example, the first electrode 21 may include stripe electrodes 214, 215. In an example, the first electrode 21 may further include three or more stripe electrodes. The numbers of the stripe electrodes included in the first electrodes 21, 22, and 23 may be the same or different, which is not limited in the present disclosure.

As shown in FIG. 8, the light emitting layer 4 may include organic light emitting blocks 41, 42, 43, and 44, the organic light emitting blocks 41 and 42 are provided corresponding to the stripe electrode 214, and the organic light emitting blocks 43 and 44 are provided corresponding to the stripe electrodes 215. The pixel defining hole 31 may include a first pixel defining hole 311, a second pixel defining hole 312, and a third pixel defining hole 313 arranged in the direction X, that is, the direction X is the width direction of the first pixel defining hole 311, the second pixel defining hole 312 and the third pixel defining hole 313, and the direction Y is the length direction of the first pixel defining hole 311, the second pixel defining hole 312, and the third pixel defining hole 313. Moreover, as shown in FIG. 8, taking the first pixel defining hole 311 as an example, the first pixel defining hole 311 may be provided corresponding to the stripe electrodes 214 and 215, so as to completely expose the length of the stripe electrodes 214 and 215 in the direction Y, and thus improving the effective light emitting area.

The numbers of stripe electrodes corresponding to the first pixel defining hole 311, the second pixel defining hole 312, and the third pixel defining hole 313 may be the same or different, which is not limited in the present disclosure. For example, as shown in FIG. 8, each pixel defining hole corresponds to two stripe electrodes; in other cases, as shown in FIG. 9, the first pixel defining hole 311 and the second pixel defining hole 312 respectively correspond to two stripe electrodes, and the third pixel defining hole 313 corresponds to a stripe electrode.

Figure 9:
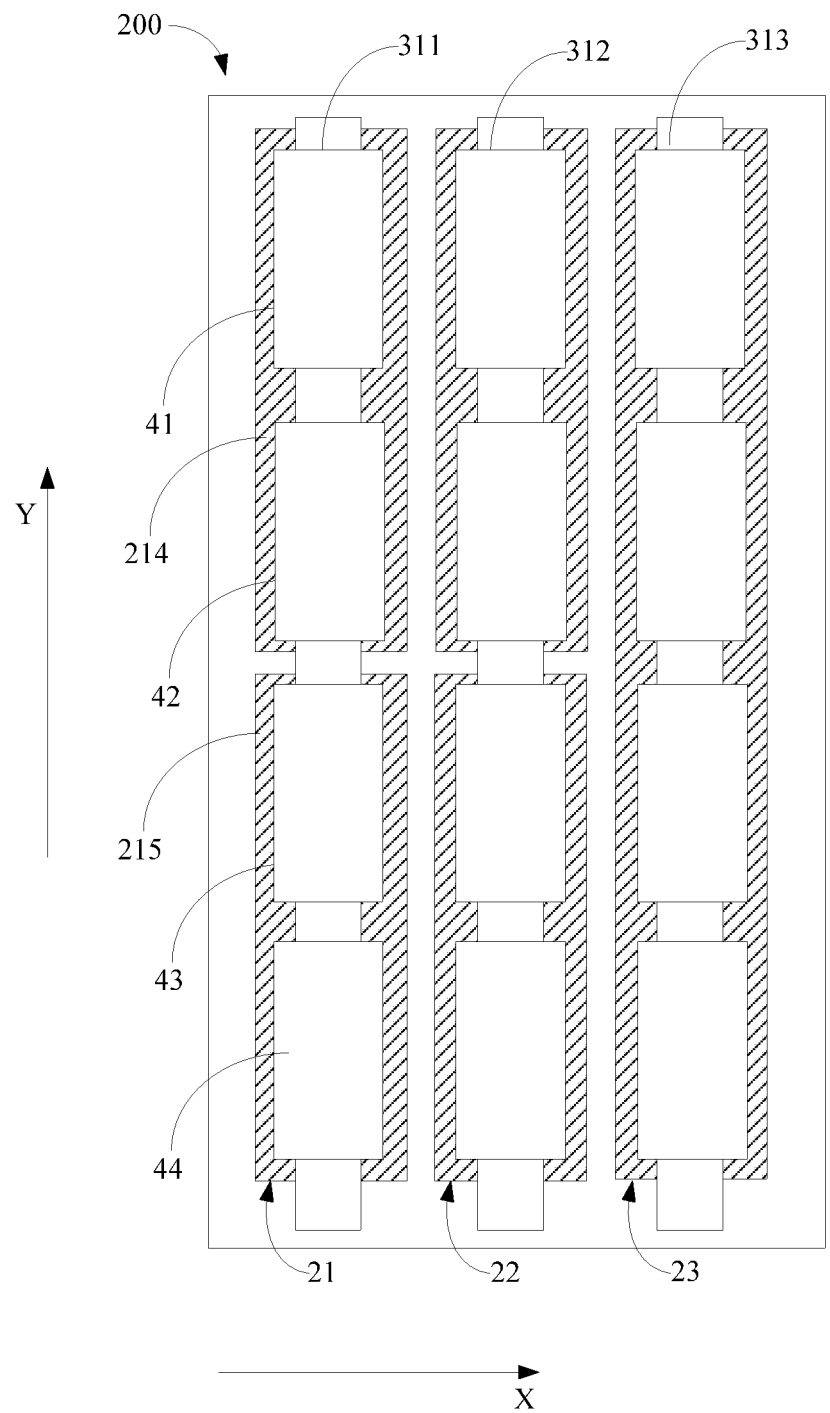
FIG. 9 is a schematic structural diagram of a transparent OLED substrate according to an example of the present disclosure.
Figure 10:
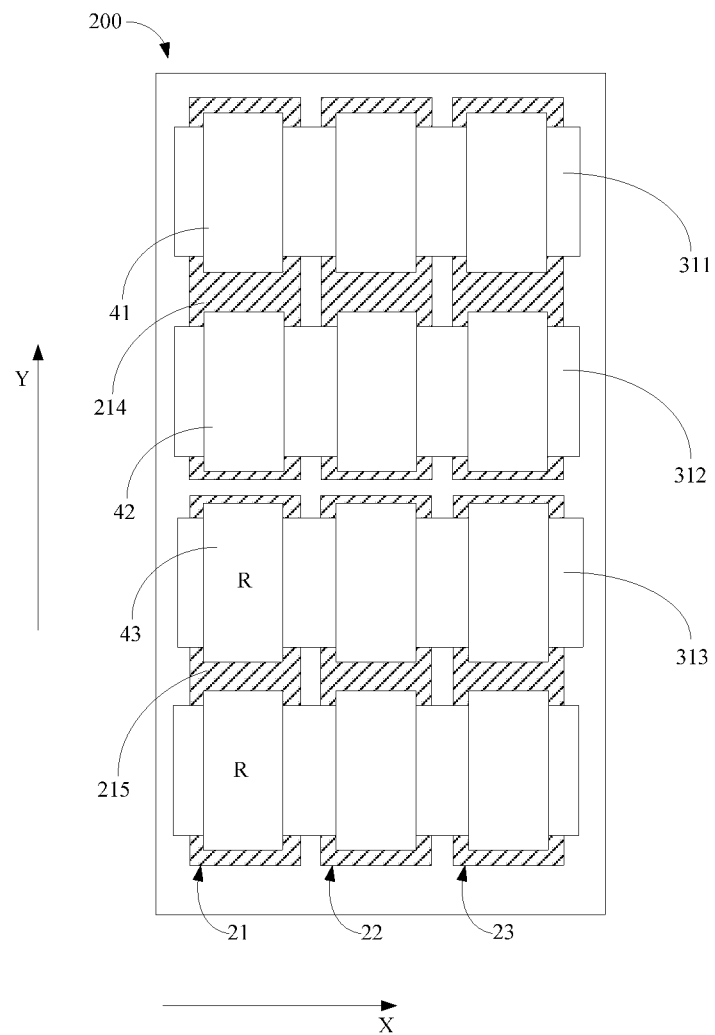
FIG. 10 is a schematic structural diagram of a transparent OLED substrate according to an example of the present disclosure.

In addition to the case where the length direction of the first pixel defining hole 311, the second pixel defining hole 312, and the third pixel defining hole 313 shown in FIGS. 8 and 9 is parallel to the longitudinal extension directions of the first electrodes 21, 22, and 23, the present disclosure may also provide another example. As shown in FIG. 10, the length direction of the first pixel defining hole 311, the second pixel defining hole 312, and the third pixel defining hole 313 are perpendicular to the longitudinal extension direction of the first electrodes 21, 22 and 23. That is, the first pixel defining hole 311, the second pixel defining hole 312, and the third pixel defining hole 313 are arranged along the direction Y, and the direction X is the length direction of the first pixel defining hole 311, the second pixel defining hole 312, and the third pixel defining hole 313.

In this example, the colors of the organic light emitting blocks corresponding to the same stripe electrode may be the same or different, and for the transparent OLED substrate 200, it may include a plurality of stripe electrodes, and of the plurality of stripe electrodes, the colors of the organic light emitting blocks corresponding to one or more stripe electrodes may be the same, and the colors of the organic light emitting blocks corresponding to one or more stripe electrodes may also be different.

Figure 11:
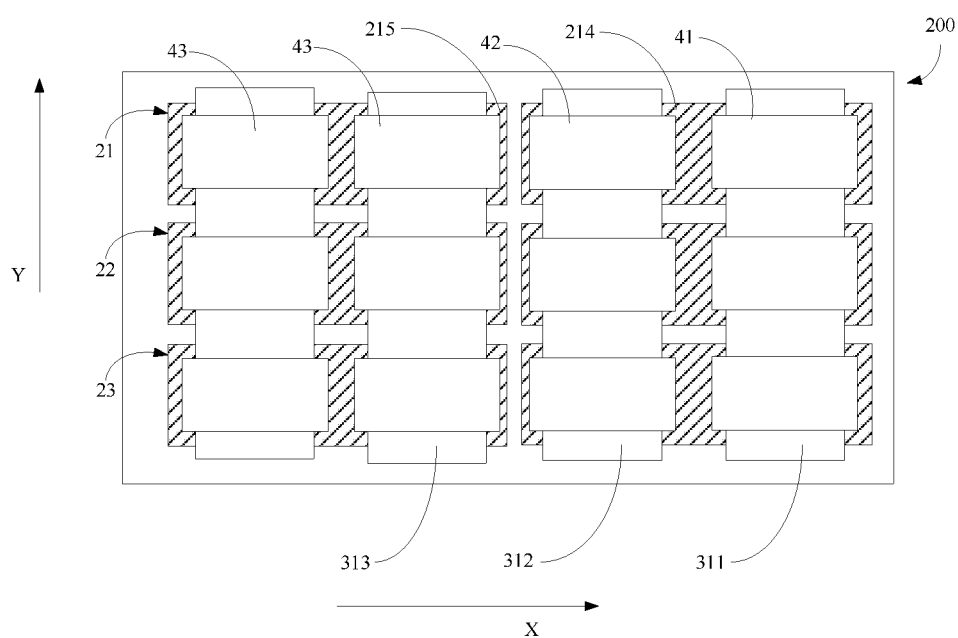
FIG. 11 is a schematic structural diagram of a transparent OLED substrate according to an example of the present disclosure.

In the above examples shown in FIGS. 4 to 10, the longitudinal extension directions of the first electrodes 21, 22, and 23 are all the direction Y. In an example, as shown in FIG. 11, the first electrodes 21, 22, and 23 may also be arranged along the direction Y and extend longitudinally in the direction X, details of which will not be elaborated herein. In addition, for the same transparent OLED substrate, the first electrodes in the same row may all be block electrodes or stripe electrodes or include both block electrodes and stripe electrodes; the first electrodes in different rows may also include different forms of electrodes, for example, the first electrodes 21 are all stripe electrodes or the first electrodes 22 are all block electrodes, and other combined forms, which will not be elaborated herein.

Figure 12:
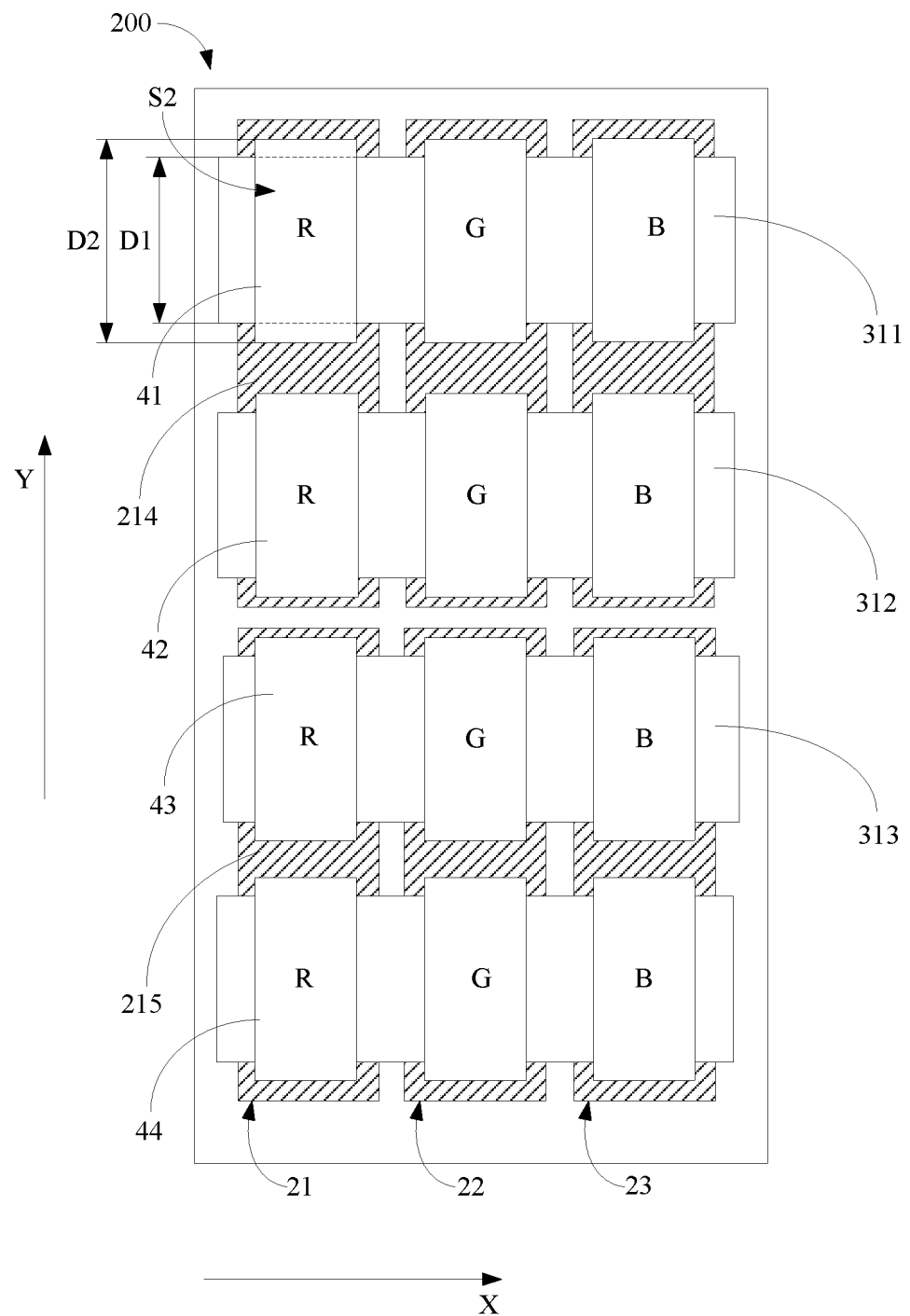
FIG. 12 is a schematic structural diagram of a transparent OLED substrate according to an example of the present disclosure.

In some examples, the colors of the organic light emitting blocks corresponding to the first electrodes in the same row may be the same. As shown in FIG. 12, the first electrode 21 corresponds to the organic light emitting blocks 41, 42, 43, and 44. The organic light emitting blocks 41, 42, 43, and 44 may each be red, the organic light emitting blocks corresponding to the first electrode 22 may each be green, and the organic light emitting blocks corresponding to the first electrode 23 may each be blue.

In an example, the colors of the organic light emitting blocks corresponding to the first electrodes in two adjacent rows may be different. In some examples, the first electrodes in every three rows may present red, green and blue colors arranged in sequence, in order to improve the display effect. For example, as shown in FIG. 12, the first electrode 21 corresponds to red organic light emitting blocks, the first electrode 22 corresponds to green organic light emitting blocks, and the first electrode 23 corresponds to blue organic light emitting blocks. Here, in FIG. 12, the electrode rows are arranged in a red-green-blue pattern, and in other examples, the arrange pattern can be blue-green-red, green-blue-red and so on, which is not limited in the present disclosure.

In an example, as shown in FIG. 12, in the direction Y, the sizes of the organic light emitting blocks 41, 42, 43, and 44 are larger than or equal to the sizes of the pixel defining holes 311, 312, and 313. Taking the organic light emitting block 41 as an example, in an example, the width of the first pixel defining hole 311 is D1, and the width of the organic light emitting block 41 is D2, then D2 so that in the width direction of the first pixel defining hole 311, it can be ensured that the organic light emitting block 41 can be in contact with all the exposed first electrode layers 2, so as to increase the area of the effective light emitting area S2 of the organic light emitting block 41 as much as possible. The boundary of the effective light emitting area S2 in the direction Y is determined by the boundary of the organic light emitting block 41 in the direction Y, and the boundary of the effective light emitting area S2 in the direction X is determined by the boundary of the first pixel defining hole 311.

The numbers of organic light emitting blocks corresponding to the block electrodes and the stripe electrodes described in the above examples are different. In the example to be described below, the block electrode and the stripe electrode are collectively referred to as electrode blocks, so that it is convenient to describe the structure and shape of the first electrode in the example.

Figure 13:
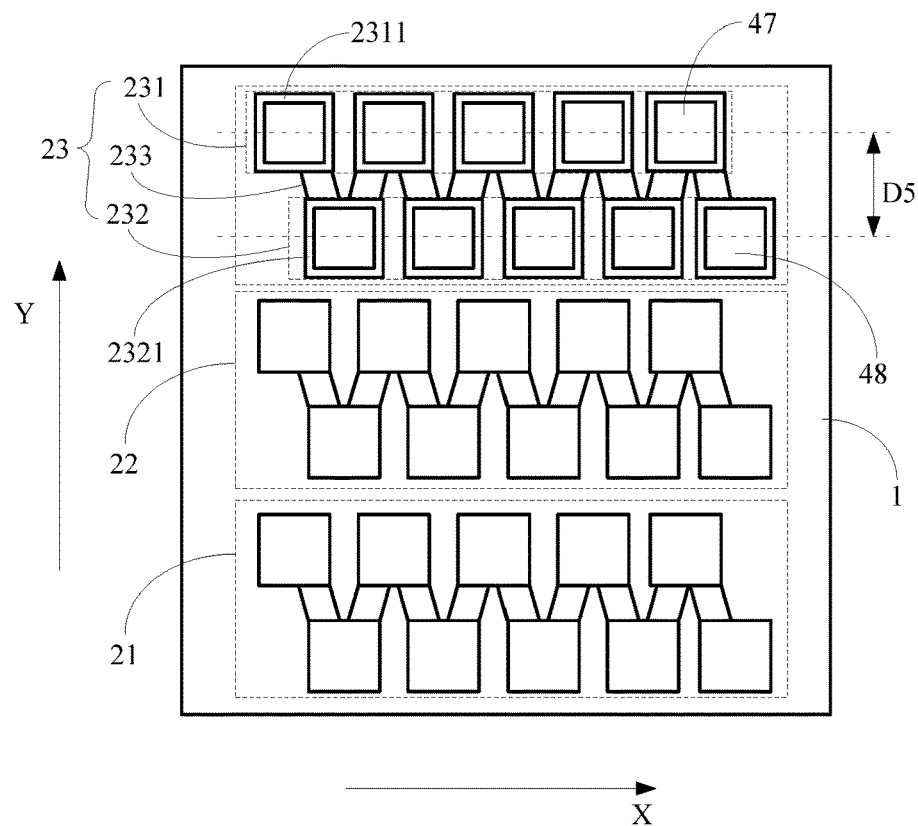
FIG. 13 is a third schematic structural diagram of a transparent OLED substrate according to an example of the present disclosure.

FIG. 13 is a schematic structural diagram of a transparent OLED substrate according to an example of the present disclosure. As shown in FIG. 13, the first electrode layer 2 may include a first electrode 21, a second electrode 22, and a third electrode 23, and the first electrode 21, the second electrode 22, and the third electrode 23 may be arranged along the direction Y and extend longitudinally in the direction X. The first electrodes 21, 22 and 23 may correspond to a plurality of columns of organic light emitting blocks arranged along the direction X, and in the direction Y, two adjacent organic light emitting blocks over the same first electrodes 21, 22 and 23 are arranged in a staggered pattern, in order to improve the display evenness of the transparent OLED substrate 200. In an example, the first electrode 21, the second electrode 22, and the third electrode 23 may be arranged in the direction X and extend longitudinally in the direction Y.

In an example, a distance between central axes of two adjacent organic light emitting blocks over the first electrode in the first direction is 0.5-2 times the size of the organic light emitting block in the first direction. As shown in FIG. 13, organic light emitting blocks 47 and 48 over the first electrode 23 are arranged in a staggered manner in the direction Y. Then, a distance between central axes of the organic light emitting blocks 47 and 48 in the direction Y is 0.5-2 times the size of the organic light emitting block 47 in the direction Y. In some examples, it can be 0.5 times, 1 time, 1.5 times, 2 times, and so on, which is not limited in the present disclosure.

Figure 14:
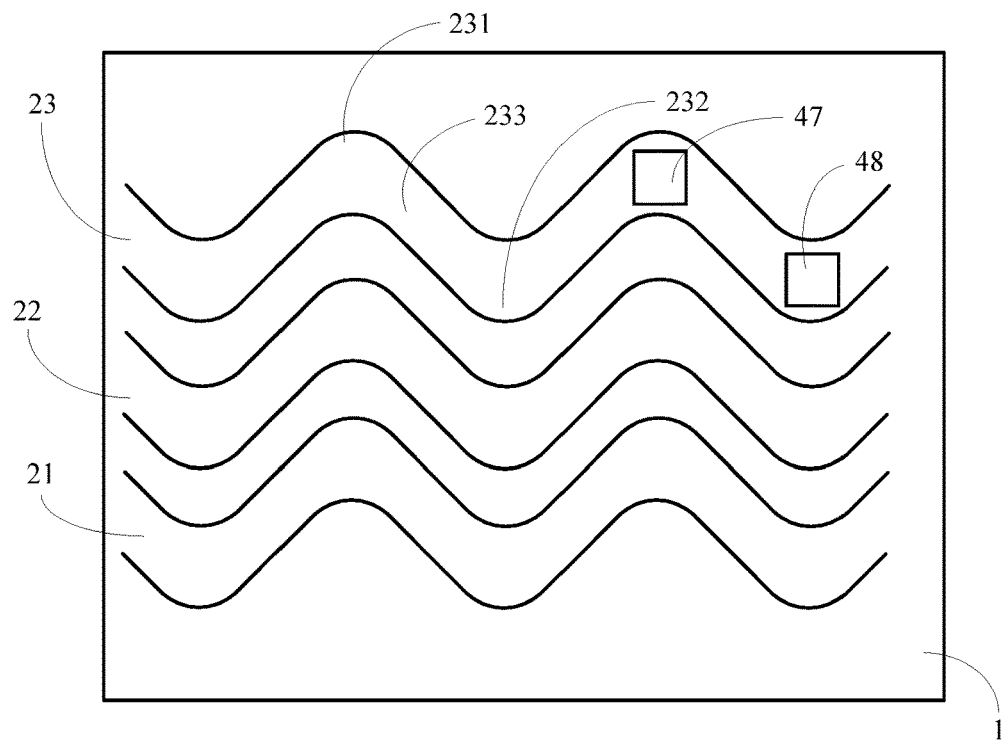
FIG. 14 is a first schematic structural diagram of a first electrode layer according to an example of the present disclosure.

FIG. 14 is a schematic structural diagram of a first electrode layer according to an example of the present disclosure. In some examples, the first electrode may include a connecting portion and a plurality of first sub-electrodes, and the adjacent first sub-electrodes are arranged in a staggered pattern in the first direction. Each first sub-electrode may include a plurality of electrode blocks, and the electrode blocks may be block electrodes or stripe electrodes. The connecting portion electrically connects two adjacent electrode blocks to obtain a first electrode that extends longitudinally along the second direction in a wave shape. In an example, as shown in FIG. 13, the first electrode 23 may include a first sub-electrode 231 and a second sub-electrode 232, and the first sub-electrode 231 may include a plurality of block electrodes 2311. There is a one-to-one correspondence between the plurality of block electrodes 2311 and the organic light emitting blocks, and the second sub-electrode 232 may include a plurality of block electrodes 2321. The first electrode 23 may further include a connecting portion 233 that connects two adjacent block electrodes. In some examples, as shown in FIG. 14, two adjacent block electrodes are connected by a connecting portion 233 to obtain a wave-shaped first electrode 23 extending in the direction X.

Figure 15:
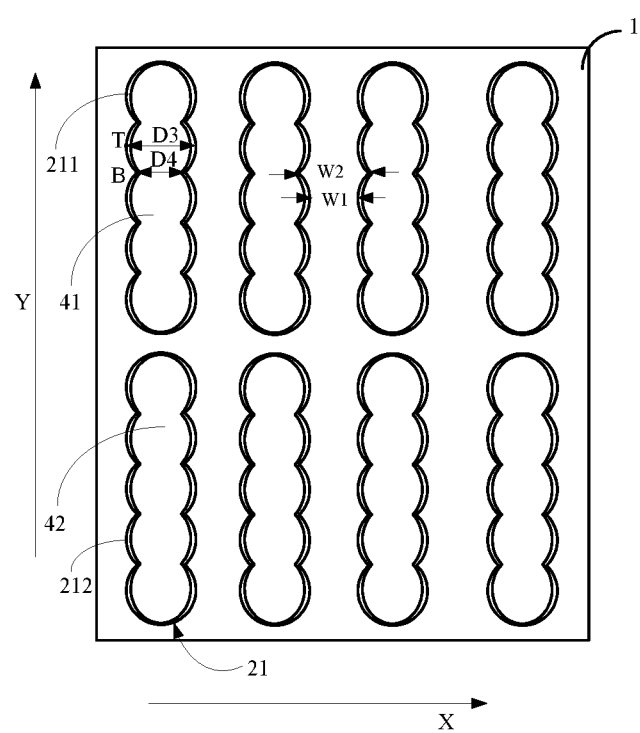
FIG. 15 is a schematic structural diagram of a first electrode layer according to an example of the present disclosure.

FIG. 15 to FIG. 21 are schematic structural diagrams of a first electrode layer according to an example of the present disclosure. Since the transparent OLED substrate 200 can allow external light to pass through, and there is a gap between adjacent first electrodes, it is easy for diffraction to occur when the light passes through. In some examples, as shown in FIG. 15, in the longitudinal extension direction of the first electrode, the two edges of each block electrode and each stripe electrode are in a wave shape, and the peaks of the two edges are arranged opposite to each other, and the troughs of the two edges are arranged opposite to each other. Therefore, the gaps between the first electrodes of two adjacent columns present continuous changes or intermittent changes in the extending direction (the direction Y in FIG. 15). In the longitudinal extension direction of the first electrode 21, the changes in widths of the first electrodes 21 are cyclic whether the changes are continuous or intermittent, and the length of one change cycle may correspond to the width of one pixel.

In an example, the transparent OLED substrate 200 may be provided with a plurality of rows of first electrodes in a wave shape, so that the width of the first electrode continuously changes or intermittently changes in the longitudinal extension direction of the first electrode, thereby making adjacent first electrodes have a continuously changing distance or an intermittently changing distance. Therefore, between different positions along the width of the first electrode and where the adjacent first electrodes have different distances therebetween, the positions of the generated diffraction fringes are different, and the diffraction effects at different positions can cancel each other, which can effectively reduce the diffraction effect, and is beneficial to improve the photographing effect of the camera below the transparent OLED substrate 200.

In an example, as shown in FIG. 15, the block electrode 211 is provided corresponding to the organic light emitting block 41, and the block electrode 212 is provided corresponding to the organic light emitting block 42. The block electrodes 211 and 212 may each include one or more peaks and one or more troughs. Taking the block electrode 211 as an example, as shown in FIG. 15, the position indicated by T is a peak, and the position indicated by B is a trough. A distance D3 between peaks of two edges is in a range of 30 um to (A−X) um; and a distance D4 between troughs of two edges is larger than X and smaller than the distance D3 between peaks, where A is a size of the organic light emitting block, X is a width value at a part of the electrode having the smallest size, and the A is larger than or equal to (30+X) um. In some examples, X may be 4 microns, and in other examples, X may be smaller than 4 microns.

Since the edges of the first electrodes change in a wave shape, the distance between adjacent first electrodes also changes accordingly. In an example, as shown in FIG. 15, the two columns of first electrodes have a minimum distance W1 between opposite peaks, and two columns of first electrodes have a maximum distance W2 between opposite troughs. Here, the minimum distance W1 is (A−D3), and the maximum distance W2 is (A−D4).

Figure 16:
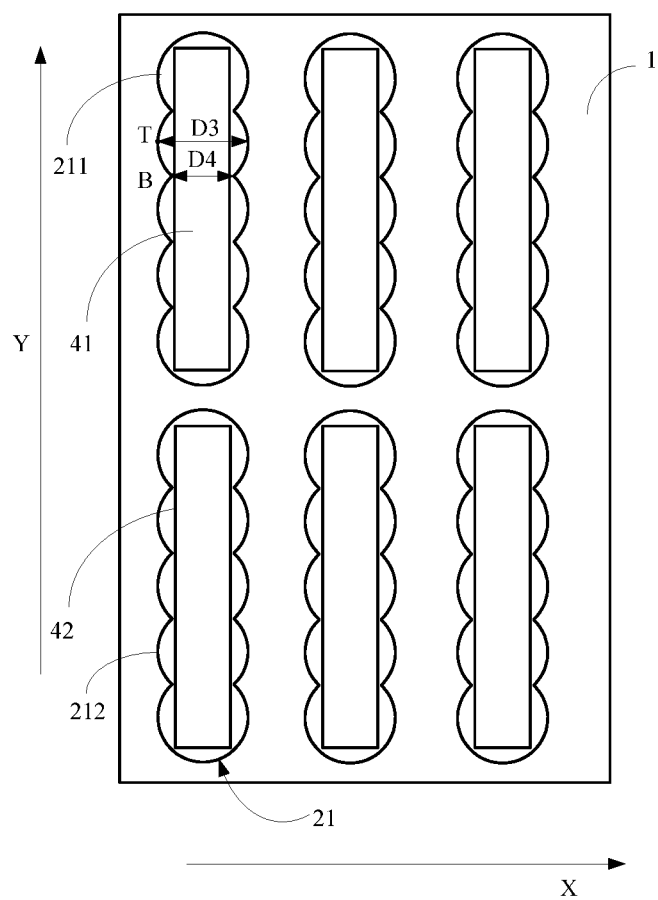
FIG. 16 is a second schematic structural diagram of a first electrode layer according to an example of the present disclosure.
Figure 17:
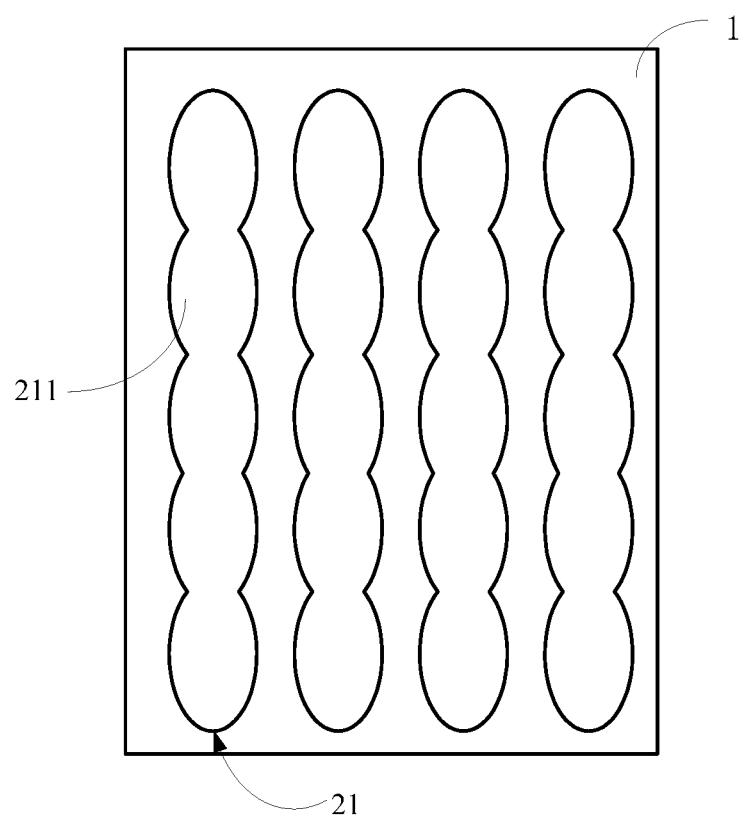
FIG. 17 is a second schematic structural diagram of a first electrode layer according to an example of the present disclosure.
Figure 18:
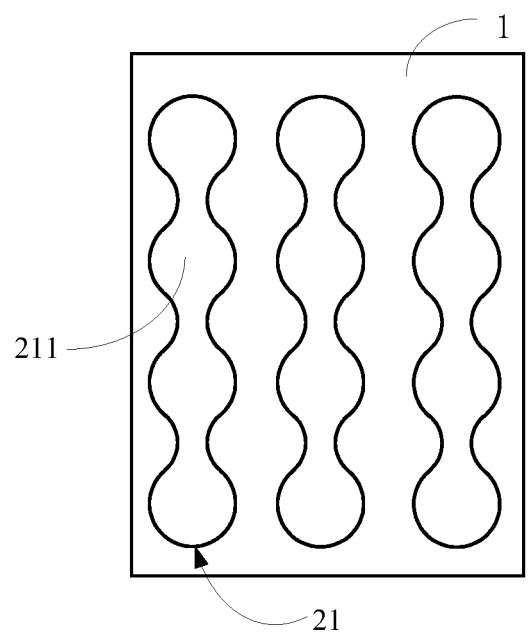
FIG. 18 is a second schematic structural diagram of a first electrode layer according to an example of the present disclosure.

In some examples, the shape of the projection of the block electrode and the stripe electrode included in the first electrode over the base substrate may include at least one first graphic unit, so as to form the above-mentioned peaks and troughs. The first graphic unit may be circular, elliptical, dumbbell-shaped, "8"-shaped, or rectangular. As shown in FIGS. 15 and 16, the block electrodes 211 and 212 are composed of a plurality of circles. In some examples, as shown in FIG. 17, the block electrode 211 may be composed of a plurality of ellipses. In some examples, as shown in FIG. 18, the block electrode 211 can be composed of a plurality of dumbbells. In some examples, the block electrode 211 may also be composed of a plurality of "8" shapes, where the "8" shape may be composed of two circles.

Figure 19:
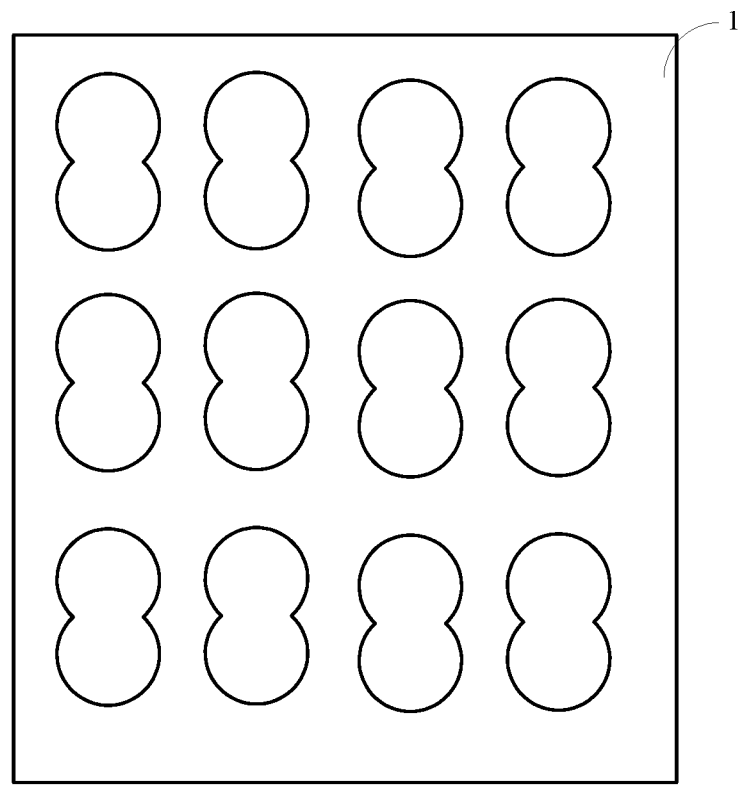
FIG. 19 is a second schematic structural diagram of a first electrode layer according to an example of the present disclosure.
Figure 20:
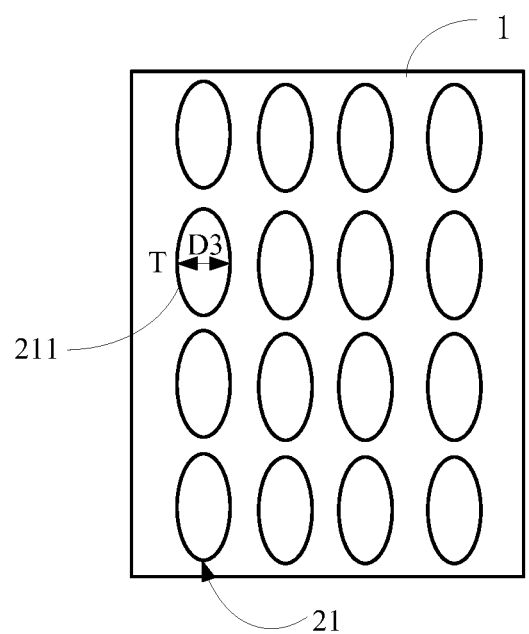
FIG. 20 is a second schematic structural diagram of a first electrode layer according to an example of the present disclosure.

In an example, the block electrode included in the first electrode 21 may also be composed of one first graphic unit. For example, as shown in FIG. 19, each first electrode 21 is composed of one "8"-shaped graphic unit. In an example, as shown in FIG. 20, since the block electrode 211 is composed of one elliptical graphic unit, then the block electrode 211 only includes peaks and no troughs, and accordingly, two columns of block electrodes 211 only have a minimum distance therebetween.

In some examples, the shape of the projection of the light emitting structure block on the base substrate may include at least one second graphic unit, so as to form the above-mentioned peaks and troughs. The second graphic unit may include a circular shape, an elliptical shape, a dumbbell shape, an "8" shape, or a rectangle shape.

In some examples, taking the block electrode 211 as an example, as shown in FIG. 15, the shape of the organic light emitting block 41 corresponding to the block electrode 211 may be of the same shape as the shape of the block electrode 211. In some examples, as shown in FIGS. 14 and 16, the shapes of the organic light emitting blocks 47 and 41 provided corresponding to the block electrode 211 may be different from the shape of the block electrode 211.

Figure 21:
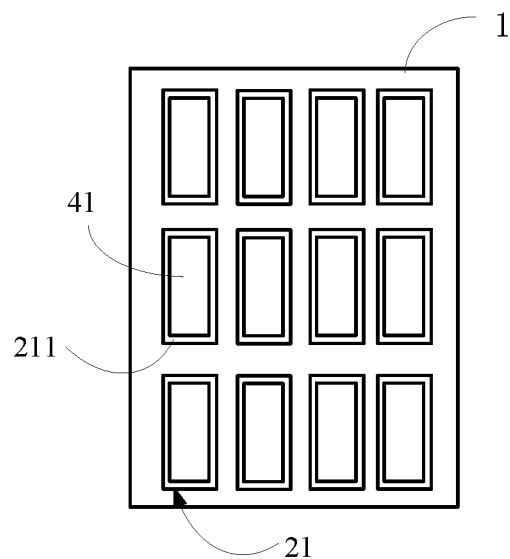
FIG. 21 is a second schematic structural diagram of a first electrode layer according to an example of the present disclosure.

In another example, as shown in FIG. 21, the edges of the block electrodes included in the first electrode 21 may also be straight edges, and each block electrode 211 may be rectangular, for example, square or rectangular, which is not limited in the present disclosure. In an example, as shown in FIG. 21, the organic light emitting block 41 corresponding to the rectangular block electrode 211 may also be rectangular. Of course, in other examples, the organic light emitting block corresponding to the rectangular block electrode may also be circular or elliptical.

Figure 22:
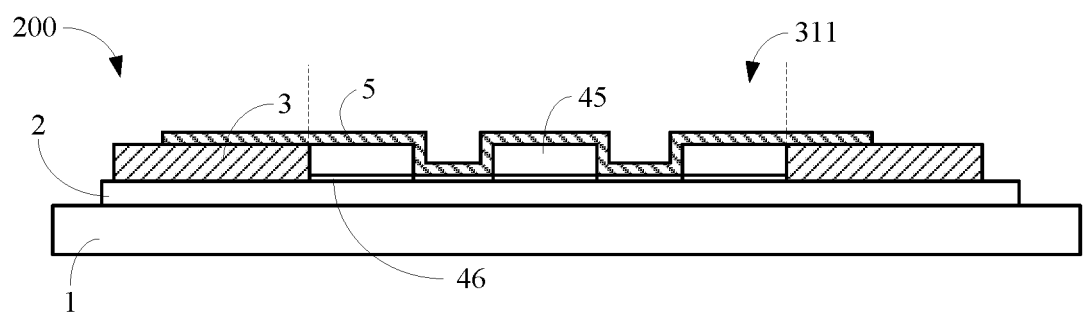
FIG. 22 is a cross sectional view of another transparent OLED substrate according to an example of the present disclosure.
Figure 23:
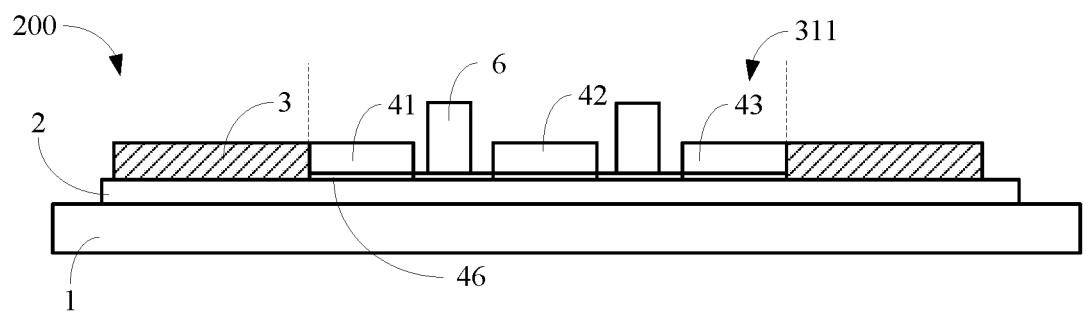
FIG. 23 is a cross sectional view of still another transparent OLED substrate according to an example of the present disclosure.
Figure 24:
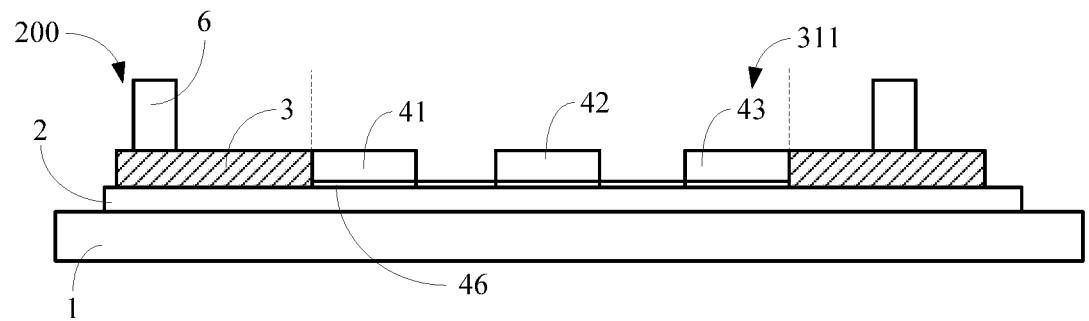
FIG. 24 is a cross sectional view of yet another transparent OLED substrate according to an example of the present disclosure.

FIGS. 22 to 24 are cross sectional views of another transparent OLED substrate according to an example of the present disclosure. In an example, as shown in FIG. 22, the first electrode layer 2 or the second electrode layer 5 may be made of a transparent material, or both of the first electrode layer 2 and the second electrode layer 5 are made of a transparent material. The light transmittance of the transparent material may be larger than or equal to 90%, so that the light transmittance of the transparent OLED substrate 200 can be further improved. For example, the light transmittance of the entire transparent OLED substrate 200 may be more than 80%. The transparent material may specifically include one or more of indium tin oxide, indium zinc oxide, silver-doped indium tin oxide, and silver-doped indium zinc oxide.

As shown in FIG. 22, the light emitting layer 4 may include an organic light emitting material layer 45 and a common layer 46. The organic light emitting material layer 45 may include a plurality of independent parts to form corresponding organic light emitting blocks. The common layer 46 may include a hole injection layer, a hole transport layer, an electron transport layer, and an electron injection layer. At least one of the hole injection layer, the hole transport layer, the electron transport layer, and the electron injection layer covers the first electrode layer 2 and the gap between the adjacent first electrodes, so that the first electrode layer 2 and the second electrode layer 5 can be isolated by one or more layers in the common layer 46 to avoid a short circuit.

As shown in FIG. 23, the transparent OLED substrate 200 may further include a transparent support layer 6. The transparent support layer 6 may be formed between two adjacent organic light emitting blocks. For example, the transparent support layer 6 may be disposed between the organic light emitting blocks 41 and 42, or between the organic light emitting blocks 42 and 43. In another example, as shown in FIG. 24, the transparent support layer 6 may also be formed over the pixel defining layer 3, which is not limited in the present disclosure. The transparent support layer 6 may be made of transparent organic material or transparent inorganic material.

Figure 25:
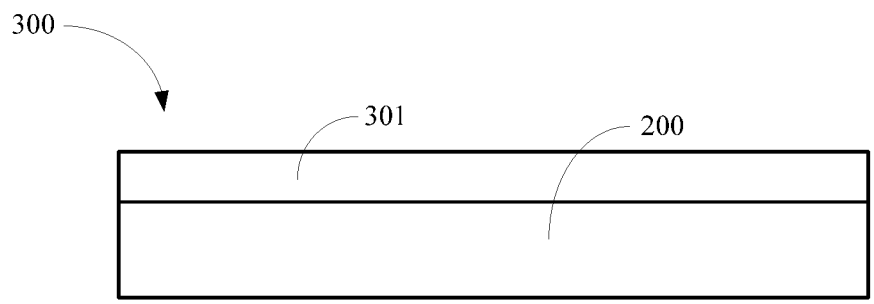
FIG. 25 is a schematic cross sectional view of a display panel according to an example of the present disclosure.

FIG. 25 is a schematic cross sectional view of a display panel according to an example of the present disclosure. As shown in FIG. 25, a display panel 300 may include an encapsulation layer 301 and a transparent OLED substrate 200 described in any of the above examples, and the encapsulation layer 301 is disposed on a side of the transparent OLED substrate 200 away from the base substrate. The encapsulation layer 301 may be made of a transparent material to prevent light entering the transparent OLED substrate 200 or light exiting the transparent OLED substrate 200 from being blocked. The encapsulation layer 301 may include an encapsulation cover plate, and the encapsulation cover plate may be secured by means of film packaging, frit packaging, or UVA glue packaging, which is not limited in the present disclosure.

Figure 26:
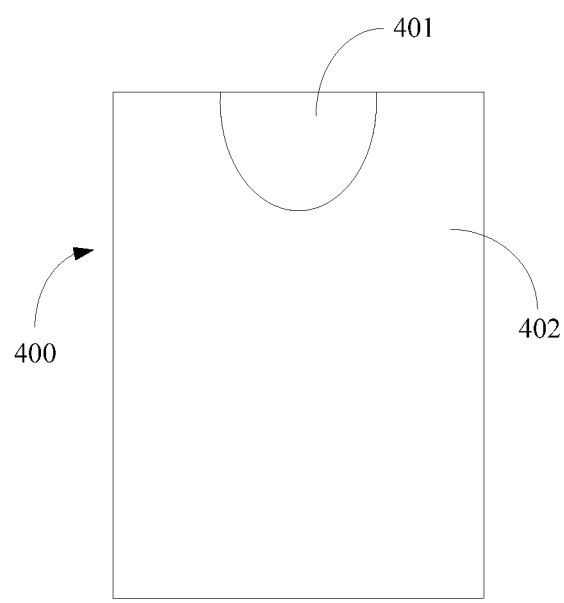
FIG. 26 is a schematic structural diagram of an OLED substrate according to an example of the present disclosure.

FIG. 26 is a schematic structural diagram of an OLED substrate according to an example of the present disclosure. As shown in FIG. 26, an OLED substrate 400 is also provided. The OLED substrate 400 may include a first OLED substrate 401 and a second OLED substrate 402. The first OLED substrate 401 may be the transparent OLED substrate described in any of the above examples, and the second OLED substrate may be a non-transparent substrate. The second OLED substrate 402 may include a base substrate, a third electrode layer formed over the base substrate, a light emitting layer formed over the third electrode layer, and a fourth electrode layer formed over the light emitting layer. The first OLED substrate 401 and the second OLED substrate 402 can share the same base substrate. The light emitting layer of the first OLED substrate 401 and the light emitting layer of the second OLED substrate 402 can be formed in the same process to reduce the number of masks and reduce production costs. Further, the cathodes of the first OLED substrate 401 and the second OLED substrate 402 may also be formed in the same process or in different processes, which is not limited in the present disclosure.

In an example, as shown in FIG. 26, at least part of the first OLED substrate 401 is surrounded by the second OLED substrate 402; or, in other examples, the first OLED substrate 401 may be fully surrounded by the second OLED substrates 402; or it may be that one edge of the first OLED substrate 401 is in contact with the opposite edge of the second OLED substrate 402. The first OLED substrate 401 may be semi-circular as shown in FIG. 26; or, in other examples, the first OLED substrate 401 may also be circular, rectangular, or elliptical.

In an example, the second OLED substrate 402 may be an AMOLED substrate or an AMOLED-like substrate. A third electrode layer in the AMOLED-like substrate includes a plurality of third electrodes. The AMOLED-like substrate also includes transistors provided corresponding to the third electrodes one by one. The transistor has a drain electrode connected to the corresponding third electrode, a source electrode connected to a data signal, and a gate electrode connected to a switching signal.

Figure 27:
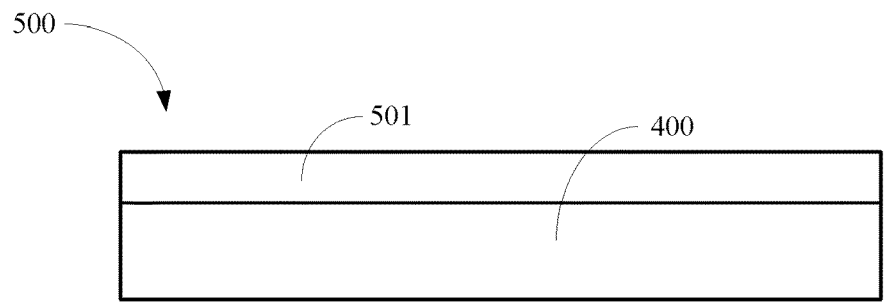
FIG. 27 is a schematic cross sectional view of a display screen according to an example of the present disclosure.

FIG. 27 is a schematic cross sectional view of a display screen according to an example of the present disclosure. As shown in FIG. 27, a display screen 500 is also provided. The display screen 500 may include an encapsulation layer 501 and the OLED substrate 400 described in any of the above examples. The encapsulation layer 501 is disposed on a side of the OLED substrate 400 away from the base substrate and a photosensitive device may be provided below the first OLED substrate 401. The display screen 500 may include a transparent display area corresponding to the first OLED substrate 401 and a non-transparent display area corresponding to the second OLED substrate 402. The photosensitive device below the first OLED substrate 401 can receive external light or emit light outward through the transparent display area. When the photosensitive device is in an operation state, the transparent display area can be switched to a non-display state, and when the photosensitive device is in an off state, the transparent display area can be switched to a display state. The encapsulation layer 501 may include a polarizer (not shown in the figure), the polarizer can cover the area corresponding to the second OLED substrate, and leave the area corresponding to the first OLED substrate uncovered, so as to prevent the arrangement of the polarizer from affecting the incident light from outside and/or the light emitted from the electronic device.

Figure 28:
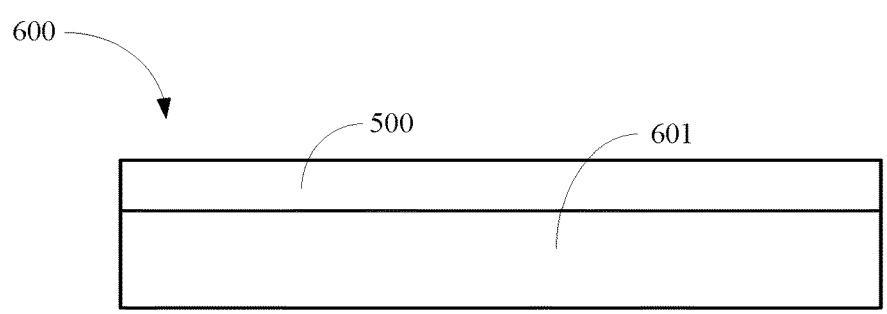
FIG. 28 is a schematic cross sectional view of a display device according to an example of the present disclosure.

FIG. 28 is a schematic cross-sectional view of a display device according to an example of the present disclosure. As shown in FIG. 28, a display device 600 may include a device body 601 and the display panel 500 described in any one of the above examples. The display panel 500 is provided on the device body 601 and connected to the device body 601. The display panel 500 can use the display panel in any of the above examples to display static or dynamic images.

Figure 29:
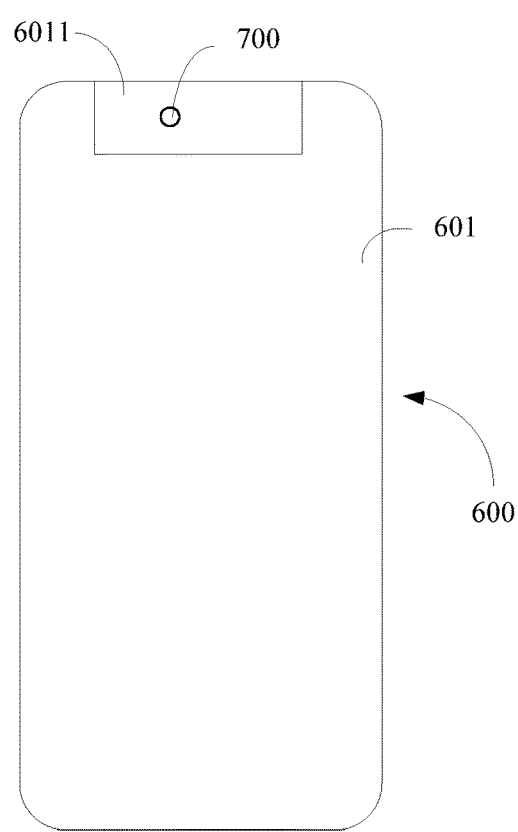
FIG. 29 is a schematic structural diagram of a display device according to an example of the present disclosure.

FIG. 29 is a schematic structural diagram illustrating a display device according to an example of the present disclosure. As shown in FIG. 29, the device body 601 may include a device area 6011, and the device area 6011 may be provided with photosensitive devices such as a camera 700 and a light sensor. The transparent display area of the display panel 500 is disposed corresponding to the device area 6011, so that the photosensitive device can collect external light through the display area and other operations. The display panel can effectively mitigate the diffraction effect generated when external light passes through the display area, thereby effectively improving the quality of the image captured by the camera 700 on the display device and avoiding image distortion due to diffraction. In addition, it can also improve the accuracy and sensitivity of the light sensor to sense external light.

The display device may be any product or component with a display function such as a liquid crystal display device, an electronic paper, a mobile phone, a tablet computer, a television, a display, a notebook computer, a digital photo frame, or a navigator.

Those skilled in the art can understand that the drawings are only schematic diagrams illustrating a preferred example, and the modules or processes in the drawings are not necessarily required to implement the present disclosure. The above is only specific implementations of the present disclosure, but the scope of protection of the present disclosure is not limited to those, and any person skilled in the art can readily think of changes within the technical scope disclosed in the present disclosure, all of them should be covered within the scope of protection of the present disclosure. Therefore, the protection scope of the present disclosure shall be subject to the protection scope of the claims.

The invention claimed is:

1. A transparent OLED substrate, comprising:
a base substrate;

a first electrode layer formed over the base substrate;
a pixel defining layer formed over the first electrode layer and comprising a plurality of pixel defining holes penetrating the pixel defining layer to the first electrode layer, an exposed area of the first electrode layer being equal to an area of the pixel defining holes;
a light emitting layer formed in the pixel defining layer and comprising organic light emitting blocks; and
a second electrode layer formed over the light emitting layer,
wherein each of the pixel defining holes corresponds to a plurality of the organic light emitting blocks,
wherein the first electrode layer comprises a plurality of rows of first electrodes arranged along a first direction, and a longitudinal direction of the first electrodes extend along the first direction or a second direction, the first direction is perpendicular to the second direction, and the second electrode layer is a planar electrode.

2. The transparent OLED substrate according to claim 1, wherein each of the first electrodes comprises at least one block electrode and all the block electrodes corresponds to the organic light emitting blocks in one-to-one correspondence, wherein each of the pixel defining holes corresponds to at least one of the block electrodes.

3. The transparent OLED substrate according to claim 1, wherein each of the first electrodes comprises at least one stripe electrode and each of the stripe electrodes corresponds to a plurality of the organic light emitting blocks, wherein each of the pixel defining holes corresponds to at least one of the stripe electrodes.

4. The transparent OLED substrate according to claim 1, wherein the organic light emitting blocks corresponding to a same row of the first electrodes have a same color; and the organic light emitting blocks corresponding to two adjacent rows of the first electrodes have a same color or different colors.

5. The transparent OLED substrate according to claim 1, wherein a length direction of the pixel defining holes is perpendicular or parallel to the first direction; and
in a width direction of the pixel defining holes, a size of the organic light emitting blocks is larger than or equal to a size of a corresponding pixel defining hole of the pixel defining holes.

6. The transparent OLED substrate according to claim 1, wherein each of the first electrodes corresponds to a plurality of rows of the organic light emitting blocks arranged along the first direction, and two adjacent organic light emitting blocks over the same first electrode are arranged in a staggered pattern in the first direction.

7. The transparent OLED substrate according to claim 1, wherein a distance between central axes of two adjacent organic light emitting blocks over the first electrode in the first direction is 0.5-2 times a size of the organic light emitting block in the first direction.

8. The transparent OLED substrate according to claim 1, wherein each of the first electrodes comprises:
a plurality of first sub-electrodes arranged in a staggered pattern, and each of the first sub-electrodes comprises a plurality of block electrodes; and
a connecting portion respectively and electrically connected with two adjacent block electrodes of the block electrodes.

9. The transparent OLED substrate according to claim 1, wherein each of the first electrodes comprises a block electrode and/or a stripe electrode, and in the second direction, each of the block electrodes and each of the stripe electrodes has two wave shaped edges with peaks of the two edges arranged opposite to each other, and troughs of the two edges arranged opposite to each other.

10. The transparent OLED substrate according to claim 9, wherein a distance between the opposite peaks of the two edges is in a range of 30 um to (A−X) um;
a distance between the opposite troughs of the two edges is larger than X and smaller than a width between the opposite peaks;
wherein A is a size of the organic light emitting blocks, X is a width value at a part of the first electrode having the smallest size, and the A is larger than or equal to (30+X) um.

11. The transparent OLED substrate according to claim 1, wherein each of the first electrodes comprises a block electrode and/or a stripe electrode, each of the block electrodes or each of the stripe electrodes has a projection on the base substrate of a shape comprising at least one first graphic unit, and the first graphic unit comprises a circular shape, an elliptical shape, dumbbell shape, an "8" shape, or a rectangular shape;
the light emitting structure block has a projection on the base substrate of a shape including at least one second graphic unit; the second graphic unit comprises a circular shape, an elliptical shape, a dumbbell shape, an "8" shape, or a rectangle shape.

12. The transparent OLED substrate according to claim 1, wherein the first electrode layer and/or the second electrode layer are made of a transparent material.

13. The transparent OLED substrate according to claim 12, wherein light transmittance of the transparent material is larger than or equal to 90%.

14. The transparent OLED substrate according to claim 1, wherein the light emitting layer comprises an organic light emitting material layer and a common layer;
the common layer comprises a hole injection layer, a hole transport layer, an electron transport layer, and an electron injection layer, and at least one layer of the common layer covers the first electrode layer and a gap between adjacent first electrodes of the first electrodes.

15. The transparent OLED substrate according to claim 1, further comprising:
a transparent support layer, wherein the transparent support layer is formed over the first electrode layer between two adjacent organic light emitting blocks; or, the transparent support layer is formed over the pixel defining layer.

16. The transparent OLED substrate according to claim 1, wherein the second electrode layer comprises a second electrode;
the second electrode is a single layer structure or a structure of laminated layers, when the second electrode is a single layer structure, the second electrode is a single metal layer, a single metal mixture layer, or a single transparent metal oxide layer; when the second electrode is a structure of laminated layers, the second electrode is a laminated-layers structure of a transparent metal oxide layer and a metal layer, or a laminated-layers structure of a transparent metal oxide layer and a metal mixture layer; or
when a material of the second electrode is doped with metal, a thickness of the second electrode is larger than or equal to 100 angstroms and smaller than or equal to 500 angstroms, the thickness of the second electrode is continuous as a whole, and a transparency of the second electrode is larger than 40%; or when the material of the second electrode is doped with metal, the thickness of the second electrode is larger than or equal to 100 angstroms and smaller than or equal to 200 angstroms, the thickness of the second electrode is continuous as a whole, and a transparency of the second electrode is larger than 40%; or when the material of the second electrode is doped with metal, the thickness of the second electrode is larger than or equal to 50 angstroms and smaller than or equal to 200 angstroms, the thickness of the second electrode is continuous as a whole, and a transparency of the second electrode is larger than 50%; or when the material of the second electrode is doped with metal, the thickness of the second electrode is larger than or equal to 50 angstroms and smaller than or equal to 200 angstroms, the thickness of the second electrode is continuous as a whole, and a transparency of the second electrode is larger than 60%; or when the second electrode is a single layer structure, a material of the single layer metal layer is Al or Ag, a material of the single layer metal mixture layer is MgAg or Al doped metal mixed material, and the transparent metal oxide is ITO or IZO.

17. A display panel, comprising:
the transparent OLED substrate according to claim 1; and
an encapsulation layer, encapsulating on a side of the transparent OLED substrate away from the base substrate.

18. An OLED substrate, comprising:
a first OLED substrate, the first OLED substrate being the transparent OLED substrate according to claim 1; and
a second OLED substrate, the second OLED substrate being a non-transparent OLED substrate, the second OLED substrate comprising a base substrate, a third electrode layer formed over the base substrate, a light emitting layer formed over the third electrode layer, and a fourth electrode layer formed over the light emitting layer;
wherein the first OLED substrate and the second OLED substrate share the same base substrate, the light emitting layer of the first OLED substrate and the light emitting layer of the second OLED substrate are formed in the same process; and
at least part of the first OLED substrate is surrounded by the second OLED substrate.

19. A transparent OLED substrate, comprising:
a base substrate;
a first electrode layer formed over the base substrate;
a pixel defining layer formed over the first electrode layer and comprising a plurality of pixel defining holes penetrating the pixel defining layer to the first electrode layer, an exposed area of the first electrode layer being equal to an area of the pixel defining holes;
a light emitting layer formed in the pixel defining layer and comprising organic light emitting blocks; and
a second electrode layer formed over the light emitting layer,
wherein each of the pixel defining holes corresponds to a plurality of the organic light emitting blocks,
wherein the light emitting layer comprises an organic light emitting material layer and a common layer;
the common layer comprises a hole injection layer, a hole transport layer, an electron transport layer, and an electron injection layer, and at least one layer of the common layer covers the first electrode layer and a gap between adjacent first electrodes of the first electrodes.

20. A transparent OLED substrate, comprising:
a base substrate;
a first electrode layer formed over the base substrate;
a pixel defining layer formed over the first electrode layer and comprising a plurality of pixel defining holes penetrating the pixel defining layer to the first electrode layer, an exposed area of the first electrode layer being equal to an area of the pixel defining holes;
a light emitting layer formed in the pixel defining layer and comprising organic light emitting blocks;
a second electrode layer formed over the light emitting layer; and
a transparent support layer, wherein the transparent support layer is formed over the first electrode layer between two adjacent organic light emitting blocks; or, the transparent support layer is formed over the pixel defining layer,
wherein each of the pixel defining holes corresponds to a plurality of the organic light emitting blocks.

* * * * *